United States Patent
Kang et al.

(10) Patent No.: US 9,245,881 B2
(45) Date of Patent: Jan. 26, 2016

(54) SELECTIVE FABRICATION OF HIGH-CAPACITANCE INSULATOR FOR A METAL-OXIDE-METAL CAPACITOR

(75) Inventors: Woo Tag Kang, San Diego, CA (US); Jonghae Kim, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 411 days.

(21) Appl. No.: 12/405,303

(22) Filed: Mar. 17, 2009

(65) Prior Publication Data
US 2010/0237463 A1 Sep. 23, 2010

(51) Int. Cl.
H01L 49/02 (2006.01)
H01L 27/08 (2006.01)
G06F 17/50 (2006.01)

(52) U.S. Cl.
CPC ........ *H01L 27/0805* (2013.01); *G06F 17/5068* (2013.01); *H01L 28/40* (2013.01); *Y10T 29/49117* (2015.01)

(58) Field of Classification Search
CPC . H01L 28/40; H01L 27/0805; H01L 27/0733; H01G 4/018–4/06
USPC ......... 438/381, 393–399, 239–242, 250–256, 438/622–641; 257/307
See application file for complete search history.

(56) References Cited

U.S. PATENT DOCUMENTS 5,935,733 A * 8/1999 Scott et al. .......... 430/5
6,228,707 B1 * 5/2001 Lin ................ 438/250
6,576,479 B2 * 6/2003 Chen et al. .......... 438/3
7,547,590 B2 * 6/2009 Yang et al. .......... 438/149
2002/0149987 A1 * 10/2002 Haeberli et al. .......... 365/226
2004/0152277 A1 8/2004 Seo
2005/0044514 A1 * 2/2005 Wu et al. .......... 716/5
2005/0164448 A1 7/2005 Okonogi et al.
2005/0205918 A1 9/2005 Abiko
2005/0272170 A1 12/2005 Hayashi
2006/0228855 A1 * 10/2006 Min et al. .......... 438/240
2007/0155090 A1 7/2007 Barth et al.
2008/0054323 A1 3/2008 Breitwisch et al.

FOREIGN PATENT DOCUMENTS

| CN | 1771603 A | 5/2006 |
|---|---|---|
| JP | 08070100 | 3/1996 |
| JP | 2001339048 A | 12/2001 |

(Continued)

OTHER PUBLICATIONS

International Search Report and Written Opinion—PCT/US2010/027450, International Search Authority—European Patent Office—Oct. 26, 2010.

(Continued)

*Primary Examiner* — Laura Menz
*Assistant Examiner* — Candice Y Chan
(74) *Attorney, Agent, or Firm* — Xiaotun Qiu

(57) ABSTRACT

Methods and devices of a capacitor in a semiconductor device having an increased capacitance are disclosed. In a particular embodiment, a method of forming a capacitor is disclosed. A section of a first insulating material between a first metal contact element and a second metal contact element is removed to form a channel. A second insulating material is deposited in the channel between the first metal contact element and the second metal contact element.

45 Claims, 14 Drawing Sheets

(56) References Cited

FOREIGN PATENT DOCUMENTS

| | | |
|---|---|---|
| JP | 2003526904 A | 9/2003 |
| JP | 2004516679 A | 6/2004 |
| JP | 2005209890 A | 8/2005 |
| JP | 2005268551 A | 9/2005 |
| JP | 2005347682 A | 12/2005 |
| JP | 2008060569 A | 3/2008 |
| JP | 2008310573 A | 12/2008 |
| KR | 1020020018279 | 3/2002 |
| KR | 1020060126795 | 12/2006 |
| KR | 100873542 | 12/2008 |
| TW | 200834820 A | 8/2008 |
| WO | 0079573 A1 | 12/2000 |
| WO | 02052618 A2 | 7/2002 |

OTHER PUBLICATIONS

Taiwan Search Report—TW099107932—TIPO—Jun. 26, 2013.
Supplementary European Search Report—EP10753969, Search Authority—The Munich, Aug. 6, 2014.

* cited by examiner

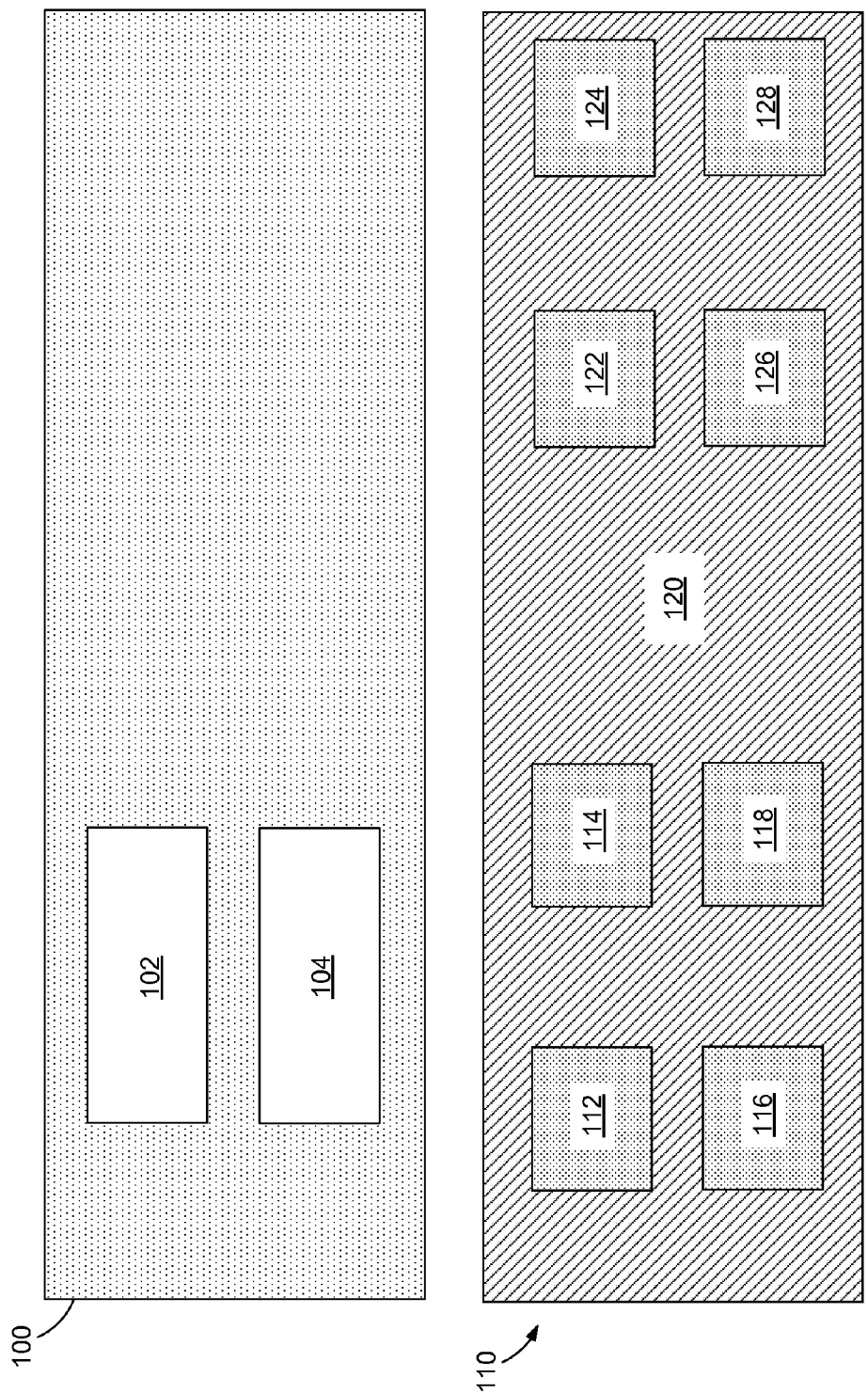

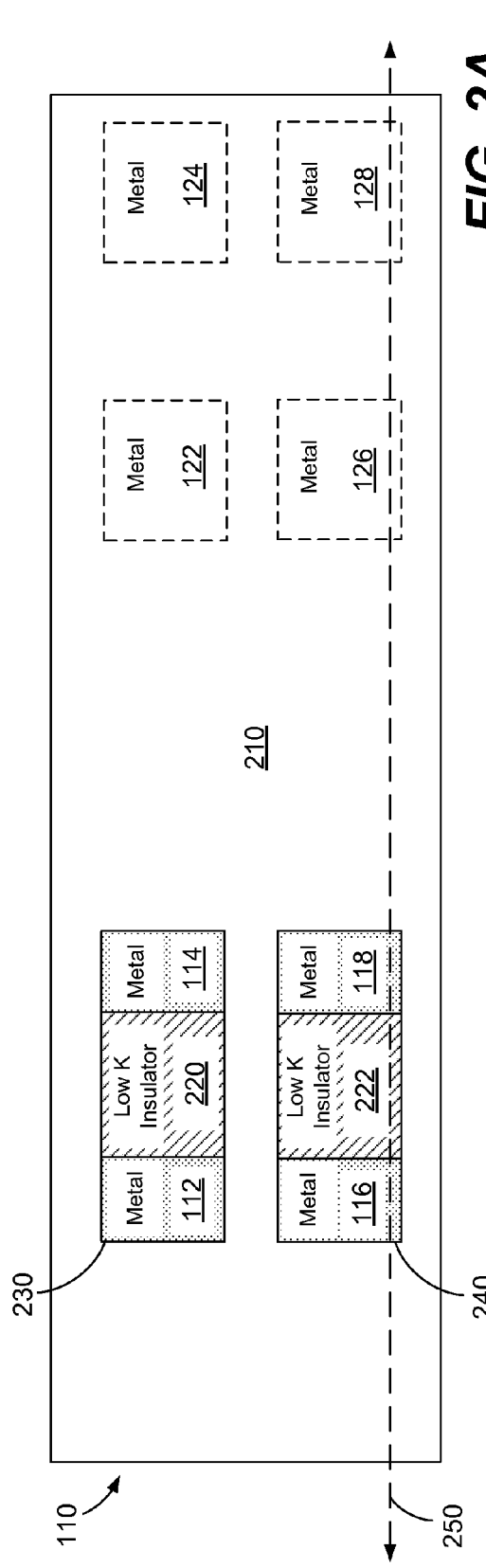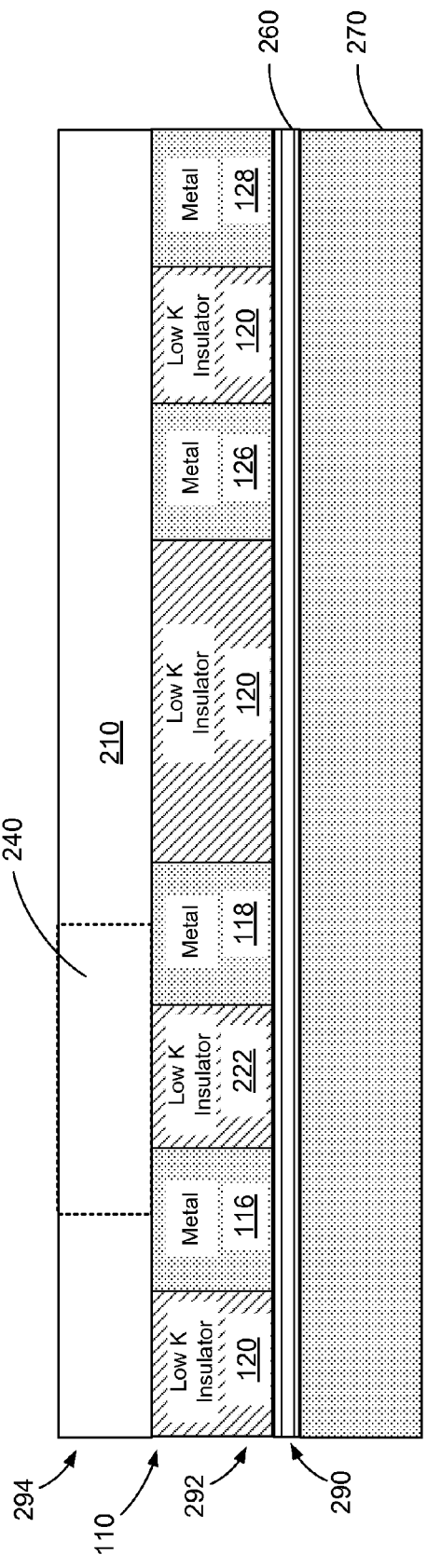

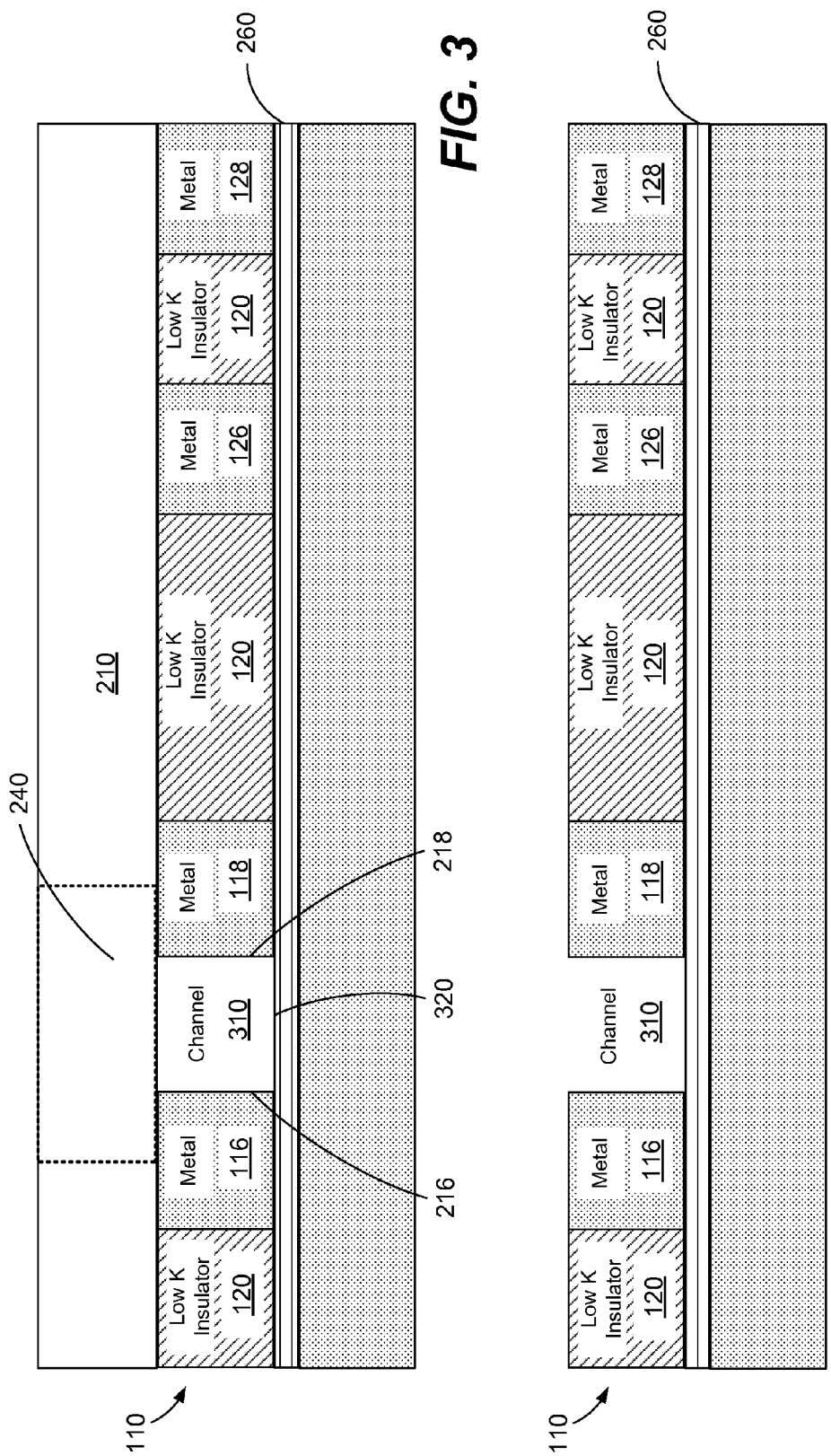

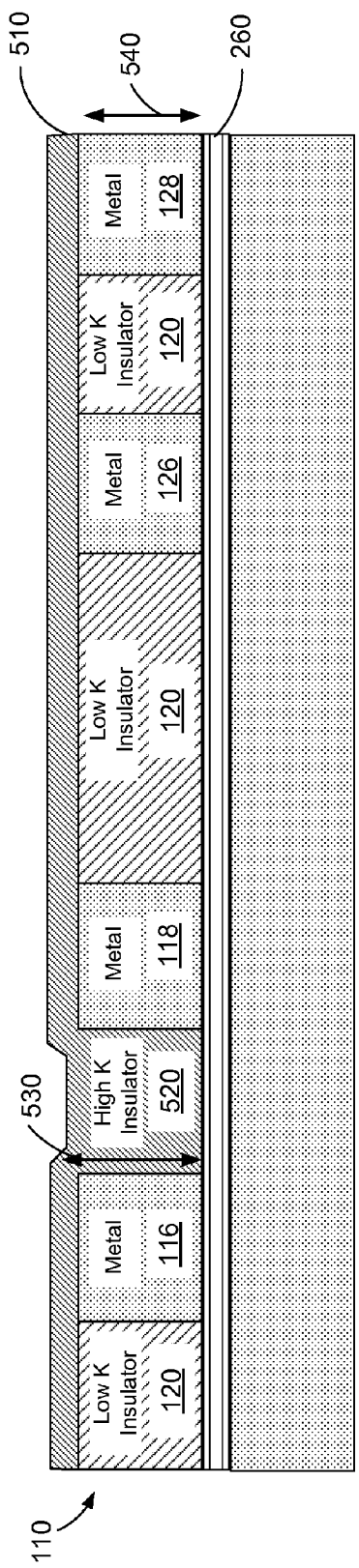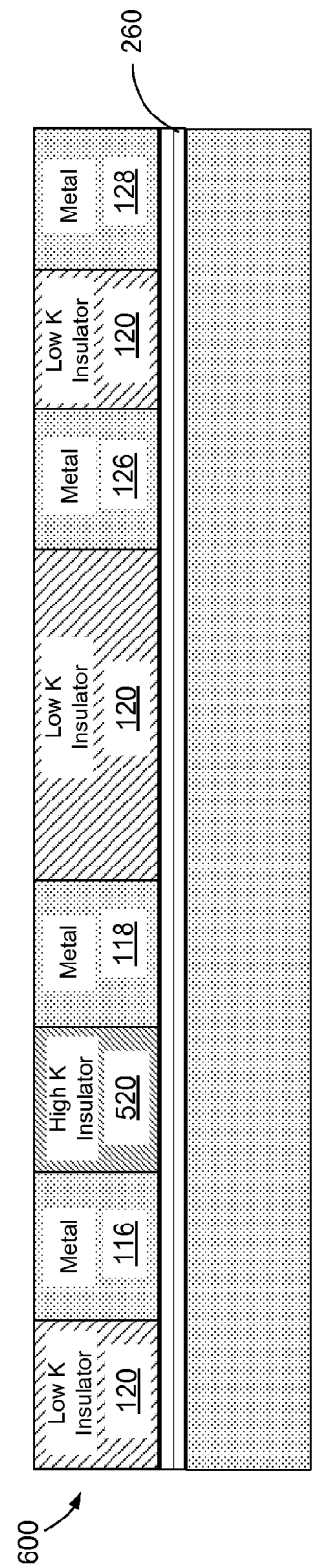

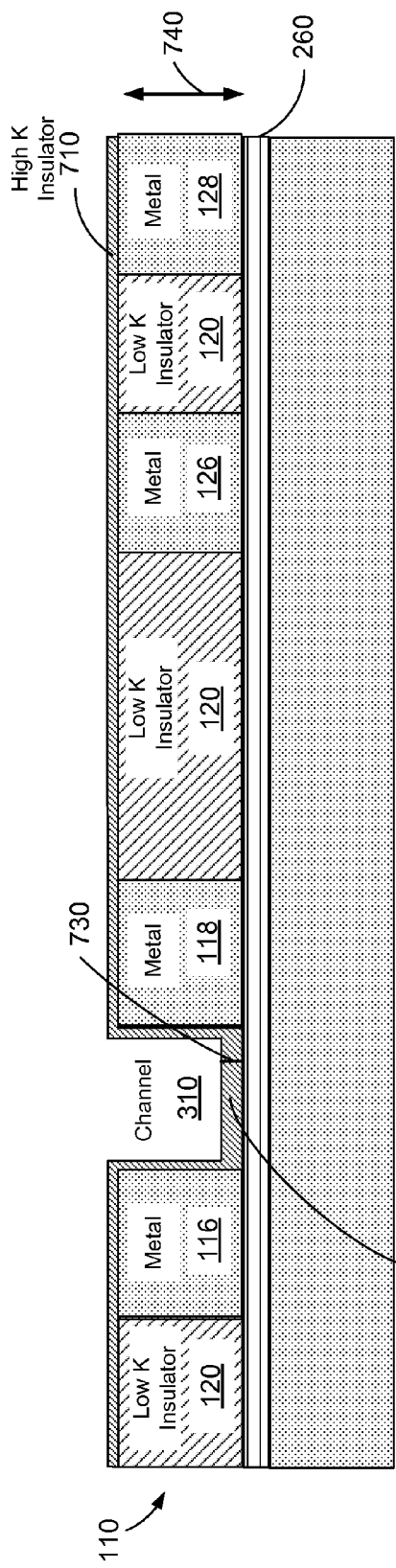
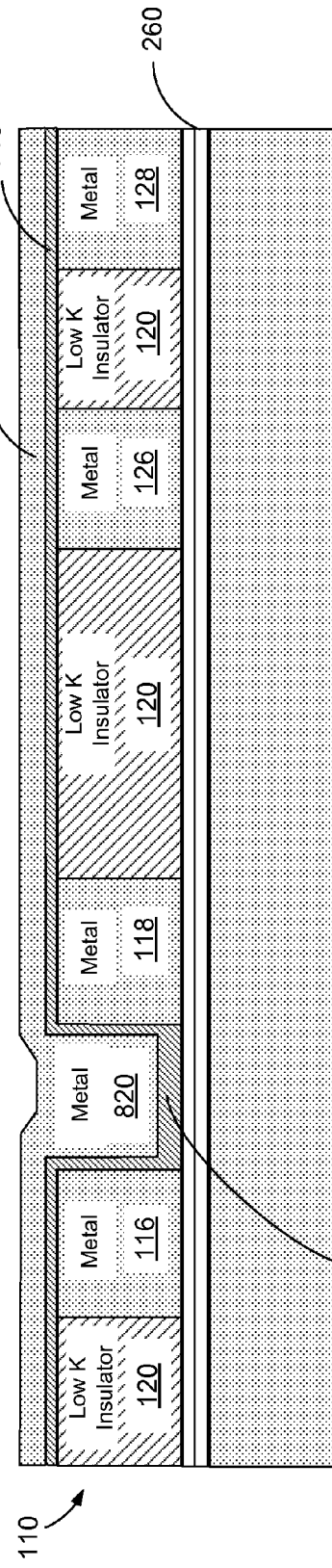

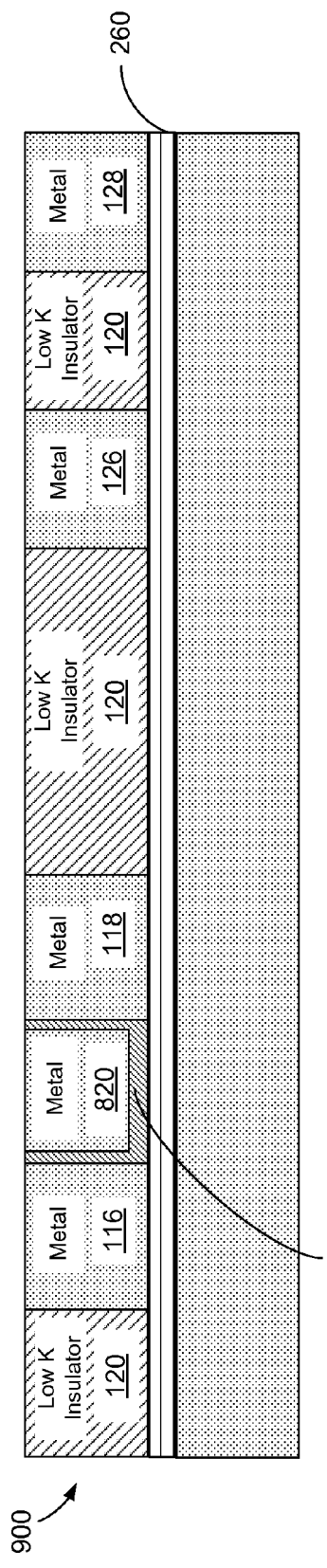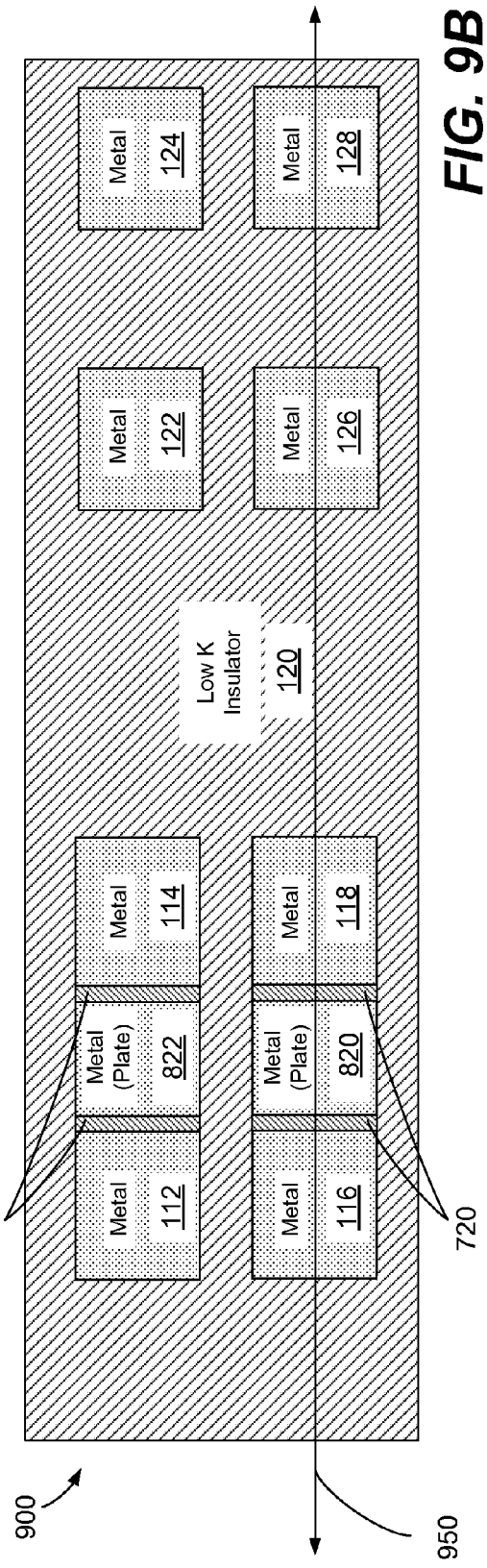

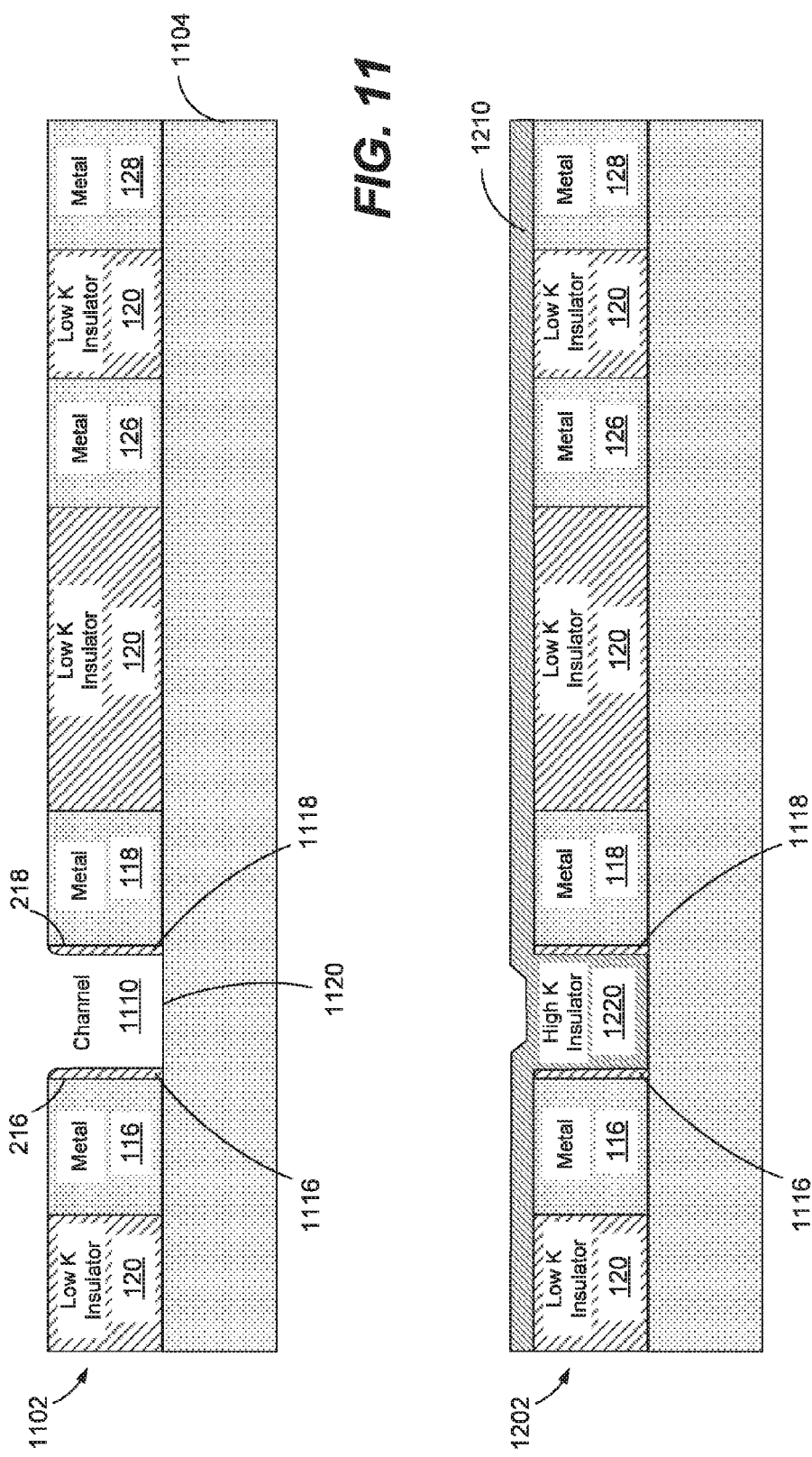

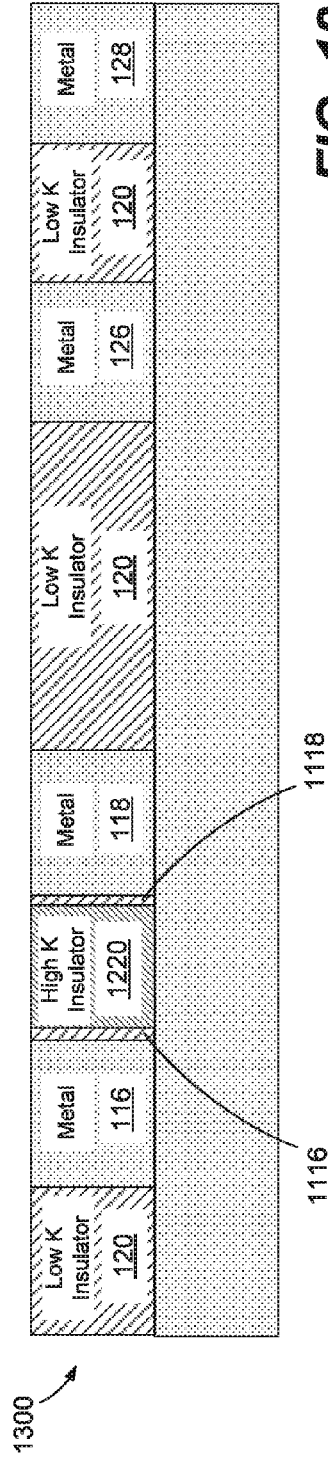
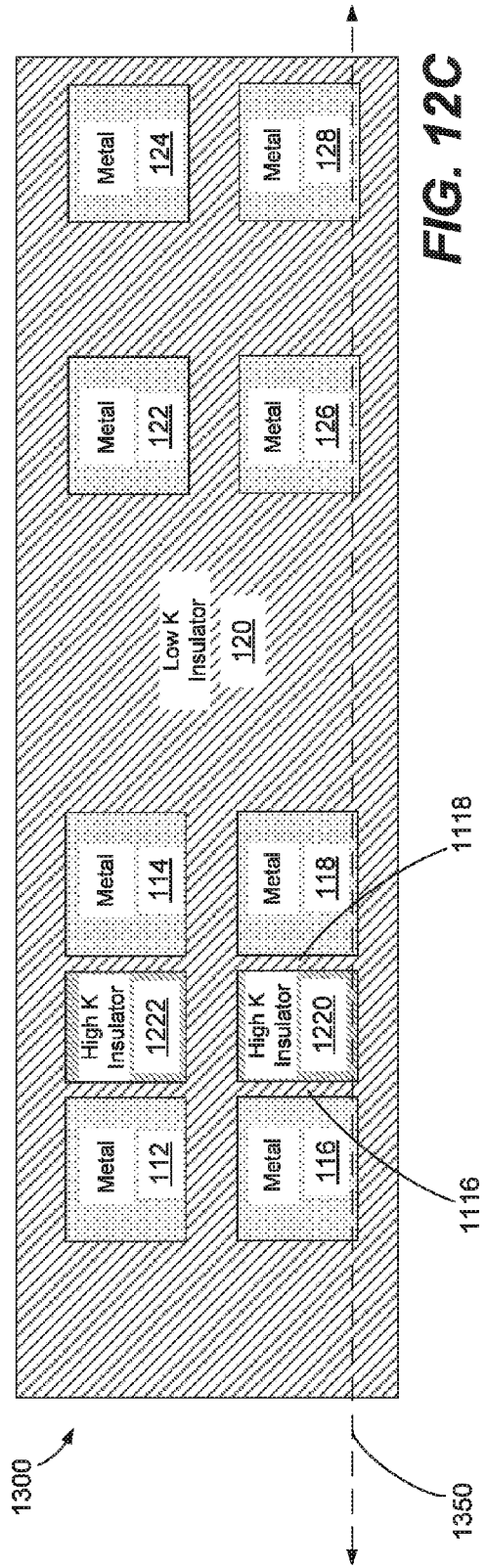

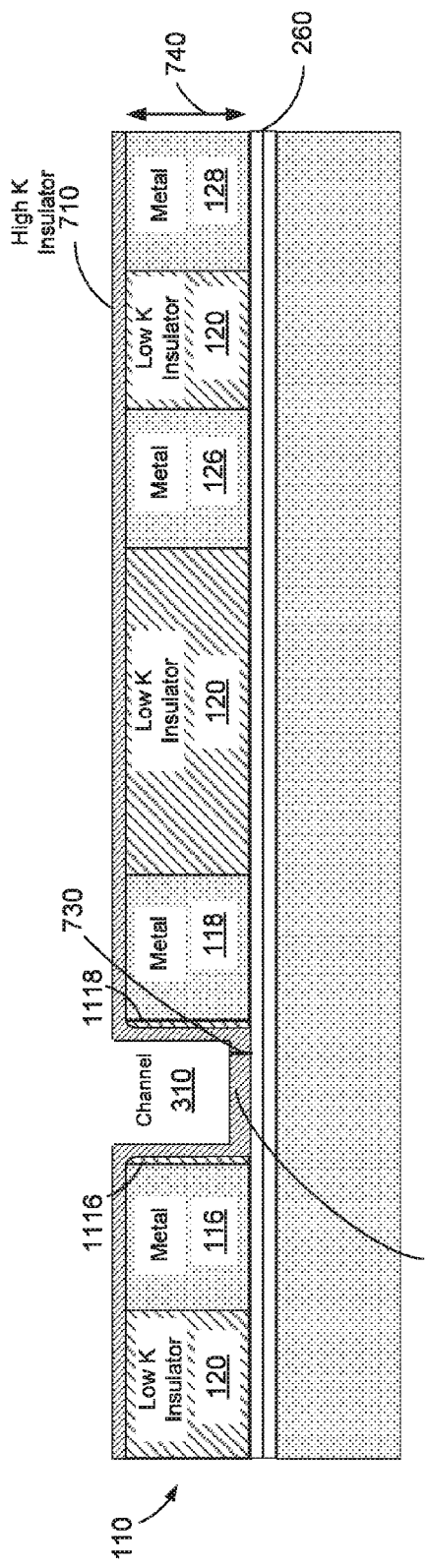
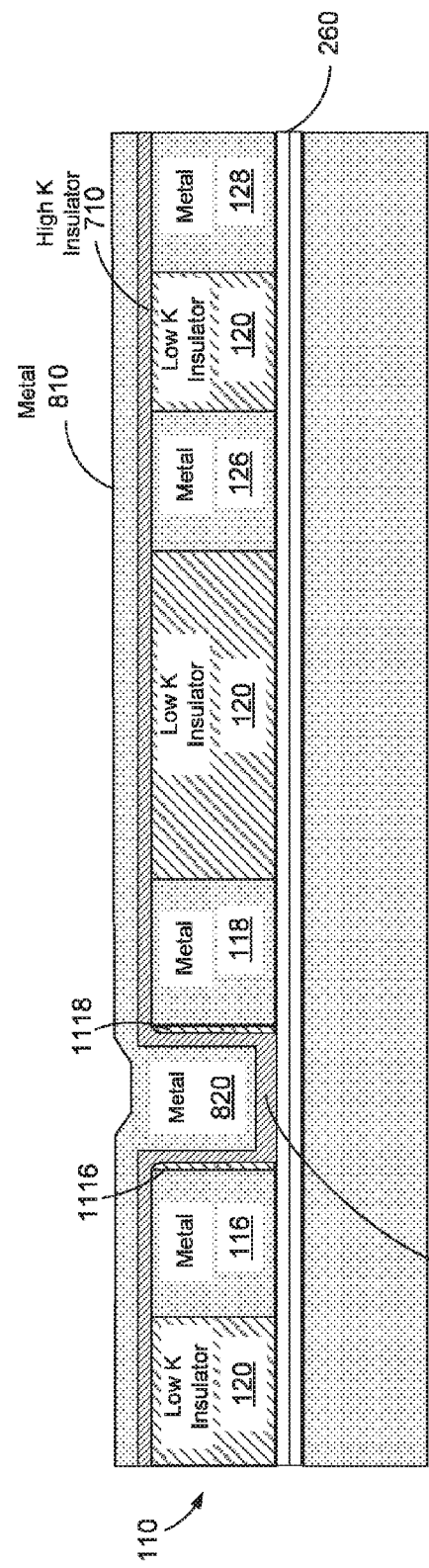
FIG. 13A
FIG. 13B

SELECTIVE FABRICATION OF HIGH-CAPACITANCE INSULATOR FOR A METAL-OXIDE-METAL CAPACITOR

I. FIELD

The present disclosure is generally related to fabricating capacitors on a semiconductor device.

II. DESCRIPTION OF RELATED ART

Increasing memory capacity in a system-on-chip semiconductor device may be used, for example, to increase on-chip cache capacity or to provide other on-chip memory facilities. Increasing memory capacity, for example, may involve increasing chip size to create space for additional memory devices. However, increasing chip size may result in increased costs.

Instead of increasing chip size to increase memory capacity, memory capacity may be increased by increasing memory device density. Increasing memory density using static random access memory (SRAM) devices may be difficult because many transistor devices are used in a single memory cell, and it would involve significant miniaturization of many devices to appreciably decrease the size of individual memory cells. On the other hand, increasing memory density in memory cells that use embedded dynamic random access memory (eDRAM) devices by increasing memory density may be difficult because decreasing the size of capacitors used to store bits of memory data reduces the retention time of the memory cells. To compensate for decreased retention times would involve refreshing memory cells more frequently, which may impede memory access, increase power consumption, and increase heat output. Realigning the memory cell capacitors by, for example, orienting plates of the capacitors to be parallel with the body of the chip instead of perpendicular to the chip, enables for higher capacitance devices to be fabricated in a small space. However, realigning the memory cell capacitors involves creating additional layers when fabricating a chip which, in turn, involves creating additional masks and performing addition photolithographic steps that increases the cost of manufacturing devices using the realigned capacitors.

III. SUMMARY

In a particular embodiment, a method of forming a capacitor is disclosed. A section of a first insulating material between a first metal contact element and a second metal contact element is removed to form a channel. A second insulating material is deposited in the channel between the first metal contact element and the second metal contact element.

In another particular embodiment, another method of forming a capacitor is disclosed. The method includes opening a portion of a photoresist layer to expose a first portion of a first metal contact element, a second portion of a second metal contact element, and a first insulating material between the first metal contact element and the second metal contact element. At least a portion of the first insulating material positioned between the first metal contact element and the second metal contact element is etched away to create a channel between the first metal contact element and the second metal contact element. A second insulating material is deposited to form a layer of a second insulating material on the first metal contact element, on the second metal contact element, and in the first channel. The layer of the second insulating material does not completely fill the channel. A metal is deposited in the first channel to form a metal plate.

In another particular embodiment, an apparatus is disclosed that includes a semiconductor device. The semiconductor device has a dielectric layer defining a first trench. The semiconductor device also has a first electrical contact element positioned at a first end of the first trench and a second electrical contact element positioned at a second end of the first trench. The semiconductor device also has a dielectric material positioned between the first electrical contact and the second electrical contact. The dielectric material defines a second trench. The semiconductor device further has a third electrical contact element positioned within the second trench.

One particular advantage provided by embodiments disclosed herein enables creation of a capacitor having a higher capacitance in a location of a semiconductor device previously occupied by a capacitor having a lower capacitance. In one embodiment, removing a section of a first insulating material that has a relatively lower permittivity between a first metal contact element and a second metal contact element, and replacing the section with a second insulating material having a higher permittivity, results in a capacitor having a higher capacitance without increasing the size of a device using the capacitor and without the capacitor occupying additional space on the device.

Another particular advantage provided by embodiments disclosed herein is derived from forming a metal plate within a layer of a second insulating material between the first metal contact element and the second metal contact element. Forming the metal plate within the layer of the second insulating material forms a pair of capacitors. The pair of capacitors includes a first capacitor between the first metal contact element and the metal plate and a second capacitor between the metal plate and the second metal contact element. By coupling the first capacitor and the second capacitor in parallel, a combined capacitor having a larger capacitance than the first capacitor or the second capacitor is formed.

Another particular advantage provided by embodiments disclosed herein is that higher capacitance capacitors may be formed by applying a single mask. According to embodiments described herein, a higher capacitance capacitor is formed by removing a first insulating material, depositing a second insulating material, and, in some embodiments, depositing a metal layer to form a metal plate. These processes are performed using only a single mask. Thus, higher capacitance capacitors may be formed without the time and cost involved in applying multiple masks.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 1 is a top view diagram of a particular illustrative embodiment of mask to be applied in creating increased density capacitors on a semiconductor device having metal contact elements and a low permittivity insulating material on a layer of a semiconductor device;

FIGS. 2A and 2B are a top view and a side cross-sectional view, respectively, of the semiconductor device of FIG. 1 over which a photoresist material has been selectively removed using the mask of FIG. 1;

FIG. 3 is a side cross-sectional view of the semiconductor device of FIGS. 2A and 2B from which a low permittivity (low K) material is removed from a portion of the semiconductor device from which the photoresist material was removed;

FIG. 4 is a side cross-sectional view of the semiconductor device of FIG. 3 from which the photoresist material has been removed;

FIG. 5 is a side cross-sectional view of the semiconductor device of FIG. 4 upon which a high permittivity (high K) has been deposited;

FIG. 6 is a side cross-sectional view of the semiconductor device of FIG. 5 from which unused portions of the high permittivity material has been removed;

FIG. 7 is a side cross-sectional view of the semiconductor device of FIG. 4 in which a high permittivity material is deposited, partially filling a channel between metal contact elements;

FIG. 8 is a side cross-sectional view of the semiconductor device of FIG. 7 in which a metal is deposited over the layer of high permittivity material;

FIGS. 9A and 9B are a side cross-sectional view and a top view, respectively, of the semiconductor device of FIG. 8 from which unused portions of the layer of high permittivity material and the layer of metal have been removed;

FIG. 11 is a side cross-sectional view of the semiconductor device of FIGS. 2A and 2B from which a portion of low permittivity material is removed from a portion of the semiconductor device;

FIG. 12A is a side cross-sectional view of the semiconductor device of FIG. 11 upon which a high permittivity material has been deposited;

FIGS. 12B and 12C are a side cross-sectional view and a top view, respectively, of the semiconductor device of FIG. 12A from which unused portions of the high permittivity material have been removed;

FIG. 13A is a side cross-sectional view of the semiconductor device of FIGS. 2A and 2B following removal of a portion of low permittivity material from a portion of the semiconductor device and deposition of a high permittivity material partially filling a channel between metal contact elements;

FIG. 13B is a side cross-sectional view of the semiconductor device of FIG. 13A in which a metal is deposited over the layer of high permittivity material;

V. DETAILED DESCRIPTION

Figure 10B:
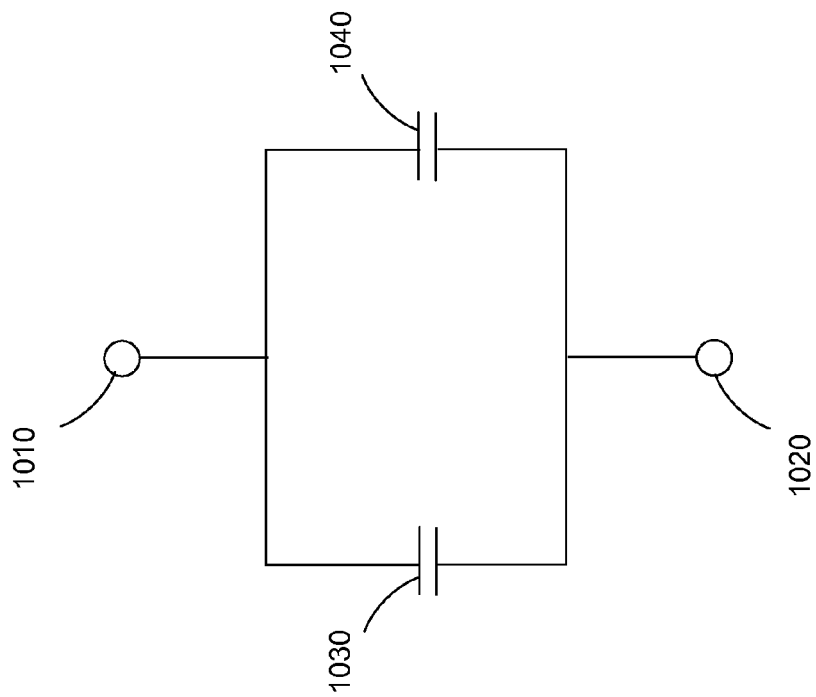
FIGS. 10A and 10B are a block diagram and a schematic diagram, respectively, of the semiconductor device of FIGS. 9A-9B electrically coupled to form a pair of capacitors connected in parallel.

FIGS. 1-6 illustrate a particular illustrative embodiment of a method for forming a capacitor having a higher capacitance in a semiconductor device. FIG. 1 is a top view diagram of a particular illustrative embodiment of a mask 100 to be applied in creating increased density capacitors on a semiconductor device 110 having metal contact elements 112-118 and 122-128 and a first insulating material, including a low permittivity (low K) insulating material 120, deposited on a layer of the semiconductor device 110. The metal contact elements 112-118 and 122-128 and the low permittivity insulating material 120 are positioned on a current layer of the semiconductor device 110 between a substrate layer and a layer of photoresist material, as described further with reference to FIGS. 2A and 2B. The substrate layer may be regarded as a first layer, a layer being developed may be regarded as a second layer, and a photoresist layer may be regarded as a third layer.

A first set of the metal contact elements 112-118 includes contact elements to be used in storage devices. The metal contact elements 112-118, thus, may be regarded as metal storage nodes. A second set of the metal contact elements 122-128 includes contact elements to be used in logic devices. According to a particular illustrative embodiment of forming increased density capacitors in the semiconductor device 110, the process is directed to altering the area around the first set of metal contact elements 112-118 without making changes to the area around the second set of metal contact elements 122-128. To this end, the mask 100 includes two openings 102 and 104. The openings 102 and 104 in the mask 100 are configured to enable the removal of the low permittivity insulating material 120 between metal contact elements 112 and 114 and between metal contact elements 116 and 118. Specifically, the openings 102 and 104 in the mask 100, as further described below, enable exposure of a photoresist layer (not shown in FIG. 1) positioned over the layer of the semiconductor device 110. Exposing the photoresist material enables etching away the low permittivity insulating material 120 left exposed by removal of the photoresist layer. As further described below, the removal of the low permittivity insulating material 120 enables the low permittivity insulating material 120 to be replaced by one or more other materials to create capacitors with higher capacitance in the space from which the low permittivity insulating material 120 has been removed.

FIGS. 2A and 2B are a top view and a side cross-sectional view, respectively, of the semiconductor device 110 of FIG. 1 over which a photoresist material 210 has been selectively removed using the mask 100 of FIG. 1. The openings 102 and 104 in the mask 100 of FIG. 1 enabled the exposure of the photoresist material 210, such as by lithography, creating opened areas 230 and 240 in the photoresist material 210. The opened area 230 exposes at least portions of the metal contact elements 112 and 114 and an exposed portion of low permittivity insulating material 220 between the metal contact elements 112 and 114. The opened area 240 includes at least portions of the metal contact elements 116 and 118 and an exposed portion of low permittivity insulating material 222. As will be described further below, the exposed portions of low permittivity insulating material 220 and 222 will be removed by a process, such as etching, to which the metal contact elements 112-118 are effectively impervious. To remove the exposed portions of low permittivity insulating material 220 and 222, portions of the metal contact elements 112-118 thus do not need to be exposed as part of the opened areas 230 and 240. However, because portions of the metal contact elements 112-118 may be exposed, the masking process may be tolerant enough to permit exposure of portions of the metal contact elements 112-118, thus allowing for some imprecision in the masking process. However, it should be noted that the masking process may be sufficiently precise as to only allow for portions of the metal contact elements 112-118 to be exposed so that the photoresist material continues to cover the low permittivity insulating material 120 that is not to be removed as part of a particular embodiment of a process as presently disclosed.

FIG. 2B is a side cross-sectional view of the semiconductor device 110 taken along a section 250 of FIG. 2A. The side cross-sectional view of the semiconductor device 110 shows the opened area 240 in the photoresist material 210 over portions of the metal contact elements 116 and 118 and the exposed portion of the low permittivity insulating material 222. The opened area 240 in the photoresist material 210 permits the exposed portion of low permittivity insulating material 222 to be removed, such as by etching, while the photoresist material 210 continues to cover and protect other portions of low permittivity insulating material 120 from being removed. For reference, the first metal contact element 116 and the second metal contact element 118 may be regarded as formed in a second layer 292 of the semiconductor device 110 between a first layer 290 with respect to a surface of a substrate, such as the etch-stop layer 260 or another layer situated in a same position, and a layer 294 that includes the photoresist layer 210.

In the side cross-sectional view of the semiconductor device 110, it should be noted that the previously described elements, including the metal contact elements 112-118 and 122-128 and the low permittivity insulating material 120 are part of a layer of the semiconductor device 110 that resides between the photoresist material 210 and another layer of the semiconductor device 110. According to a particular illustrative embodiment of a method of the present disclosure, the layer opposite the photoresist material 210 may include an etch-stop layer 260 comprised of a material resistant to etching to prevent etching of the current layer from affecting an underlying layer 270. Alternatively, as described with reference to FIG. 11, the etch-stop layer 260 may be omitted. Either an underlying layer 270 or an etch-stop layer 260 may represent a substrate on which the metal contact elements 112-118 and 122-128 and the low permittivity insulating material 120 are deposited.

FIG. 3 is a side cross-sectional view of the semiconductor device 110 that shows the semiconductor device 110 with the exposed portion of low permittivity insulating material 222 of FIGS. 2A-2B removed to form a channel 310. The channel 310 is defined by a first surface 216 of a first metal contact element, a second surface 218 of a second metal contact element 118, and a surface 320 of a layer opposite the photoresist layer, such as presented by the etch-stop layer 260.

FIG. 4 is a side cross-sectional view of the semiconductor device 110 that shows the remainder of the photoresist material 210 having been removed after the formation of the channel 310. Once portions of the semiconductor device 110 have been etched as desired, such as the channel 310, the photoresist material 210 is no longer needed to protect portions of the semiconductor 110 and, thus, the photoresist material 210 is no longer necessary.

FIG. 5 is a side cross-sectional view that shows the semiconductor device 110 after the deposition of a second insulating material, including a high permittivity (high K) insulating material 510, upon the semiconductor device 110. The deposition of the high permittivity insulating material 510 fills the channel 310 of FIGS. 3-4 with a section of high permittivity insulating material 520. Within the channel, the section of high permittivity insulating material 520 has a layer thickness 530 equal to, or exceeding, a thickness 540 of the second layer currently being configured.

FIG. 6 is a side cross-sectional view that shows a resulting semiconductor device 600 formed according to a particular illustrative embodiment of a method as presently disclosed. The resulting semiconductor device 600 is produced by using a planarization process to remove the high permittivity insulating material 510 deposited on the semiconductor device 110 except for the section of high permittivity insulating material 520 that filled the channel 310 of FIGS. 3-4. The semiconductor device 600 features a capacitor, including the metal contact element 116, the section of high permittivity insulating material 520, and the metal contact element 118, that has a higher capacitance and, thus, a longer retention time. The higher capacitance device was formed using a single mask to selectively remove a portion of low permittivity insulating material enabling the high permittivity insulating material to be deposited to form the capacitor having the higher capacitance.

FIGS. 7-9B illustrate steps of another particular illustrative embodiment of a method presently disclosed for forming a capacitor having a higher capacitance in a semiconductor device. The method described has the same initial steps as the method previously described with regard to FIGS. 1-6. Specifically, the method of FIGS. 7-9B also begins with selectively removing a portion of low permittivity insulating material as described with reference to FIGS. 1-4. Thus, in this second particular illustrative embodiment of a method, FIG. 7 may be regarded as continuing the method after the formation of the channel 310 in the semiconductor device 110 as shown in FIG. 4.

FIG. 7 is a side cross-sectional view that shows the semiconductor device 110 after the deposition of a high permittivity insulating material 710 upon the semiconductor device 110. In contrast to the deposition of the high permittivity insulating material 510 of FIG. 5, however, the deposition of the high permittivity insulating material 710 is configured to deposit a layer of high permittivity material 720 within the channel 310, rather than fill the channel 310 as in the example of FIG. 5. In other words, a thickness 730 of the resulting layer of high permittivity material 720 deposited within the channel is less than a layer thickness 740 of the second layer currently being configured.

FIG. 8 is a side cross-sectional view that shows the semiconductor device 110 after the deposition of a metal material 810 over the layer of high permittivity material 710. The deposition of the metal material 810 is configured to deposit a section of metal 820 to fill the remainder of the channel 310.

FIG. 9A is a side cross-sectional view that shows a resulting semiconductor device 900 formed according to a particular illustrative embodiment of a method as presently disclosed. The resulting semiconductor device 900 is produced by using a planarization process to remove the high permittivity insulating material 710 and the metal 810 deposited on the semiconductor device 110 except for the layer of high permittivity insulating material 720 and the section of metal 820 that fill the channel 310 of FIGS. 3-4. As will be described below with reference to FIGS. 10A-10B, the introduction of the metal 820 in the layer of high permittivity insulating material 720 provides a pair of capacitors that can be coupled in parallel to create a capacitor having a high capacitance.

FIG. 9B is a top view that shows the resulting semiconductor device 900, wherein the side cross-sectional view of FIG. 9A is a view along a section 950. As shown in FIG. 9B, the previously-formed channel 310 is now filled with metal, so as to create a metal plate 820, encapsulated in a layer of high permittivity insulating material 720, between metal contact elements 116 and 118. Using the same process, multiple similar constructions may result, such as the metal plate 822 encapsulated in a layer of high permittivity insulating material 722, between metal contact elements 112 and 114.

Figure 10A:
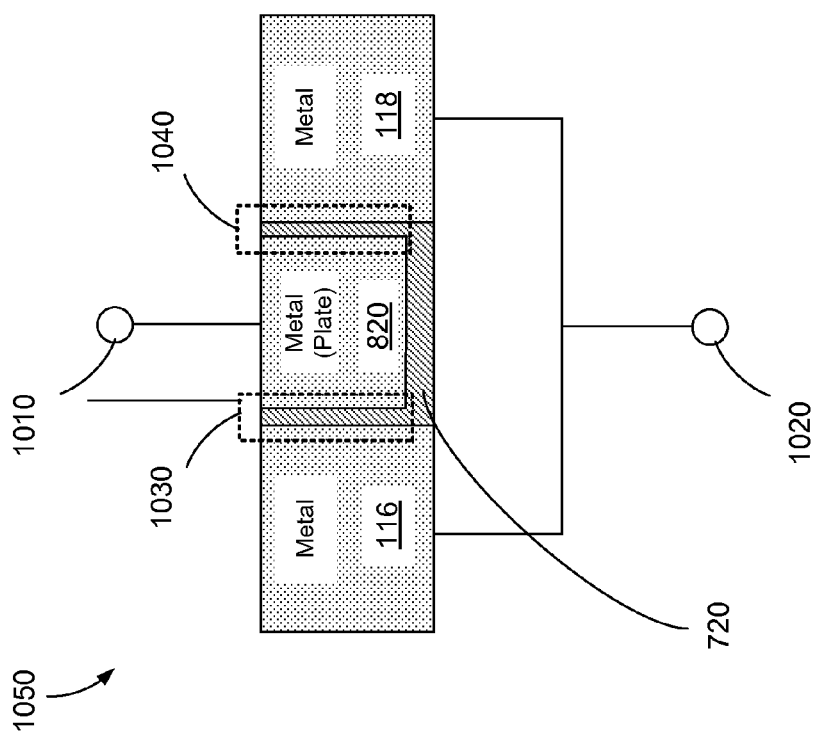

FIGS. 10A and 10B are a block diagram and a schematic diagram, respectively, of the semiconductor device of FIGS. 9A-9B electrically coupled to form a pair of capacitors connected in parallel. FIG. 10A is a portion of the side cross-sectional view of FIG. 9A that shows the metal contact elements 116 and 118 surrounding the layer of high permittivity insulating material 720 and the metal plate 820. A first capacitor 1030 includes the metal contact element 116 and the metal plate 820 surrounding a portion of the layer of high permittivity insulating material 720. A second capacitor 1040 includes the metal plate 820 and the metal contact element 118 surrounding another portion of the layer of high permittivity insulating material 720. By electrically coupling a first contact 1020 to both the metal contact elements 116 and 118 and electrically coupling a second contact 1010 to the metal plate 820 couples the first capacitor 1030 and the second capacitor 1040 in parallel, as represented by the schematic diagram of FIG. 10B. Coupling capacitors in parallel between two contacts has the effect of combining the capacitance of each of the capacitors between the two contacts to form an enhanced capacitor 1050 where the first contact 1020 is a first capacitor contact of the enhanced capacitor and where the second contact 1010 is a second capacitor contact of the enhanced capacitor. Thus, connecting the capacitors of FIG. 10A as shown adds the capacitance value of the capacitors 1030 and 1040 to yield the capacitance of the enhanced capacitor 1050. Assuming the capacitance value of the capacitors 1030 and 1040 are approximately equal, combining the capacitance value of the capacitors 1030 and 1040 approximately doubles the capacitance value of either of the capacitors 1030 and 1040 alone.

Thus, the semiconductor device 900 of FIGS. 9A-9B features a capacitor, including the metal contact element 116, the layer of high permittivity insulating material 720, the metal contact element 118, and the metal plate 820, that has a higher capacitance and, thus, a longer retention time. The higher capacitance device was formed using a single mask to selectively remove a portion of low permittivity insulating material enabling the high permittivity insulating material and the metal material to be deposited to form the two capacitors that may be coupled in parallel to form a capacitor having the higher capacitance.

FIGS. 11-12C illustrate steps of another particular illustrative embodiment of a method presently disclosed for forming a capacitor having a higher capacitance in a semiconductor device. The method described has the same initial steps as the method previously described with regard to FIGS. 1-6. However, in contrast to the method as illustrated in FIG. 4 in which all of the exposed section of low permittivity insulating material 222 is removed between metal contact elements 116 and 118, as shown in FIG. 11, some of the exposed portion of the low permittivity insulating material 222 is left in place. Thus, a layer of low permittivity insulating material 1116 is formed on a first surface 216 of a first metal contact element 116, and another layer of a low permittivity insulating material 1118 is formed on a second surface 218 of a second metal contact element 118. The layers of low permittivity insulating material 1116 and 1118 and a surface 1120 of a layer opposite the position formerly occupied by the photoresist layer define a channel 1110.

In contrast to the semiconductor device of FIG. 4, for example, the semiconductor device 1102 of FIG. 1 does not include an etch-stop layer 260 as included in FIG. 4. Instead, the metal contact elements 116 and 118 and the low permittivity insulating material 120 used in the layer being modified are disposed directly on an adjacent layer 1104 of the semiconductor device 1102. The process may be performed without an etch-stop layer 260 if using dry etching or otherwise taking care not to remove material that is desired to be left in place.

FIG. 12A is a side cross-sectional view of a semiconductor device 1202 on which a high permittivity material 1210 has been deposited. The high permittivity material 1210 is deposited to fill the channel 1110 of FIG. 11 with a section of high permittivity insulating material 1220.

FIG. 12B is a side cross-sectional view that shows a resulting semiconductor device 1300 formed according to a particular illustrative embodiment of a method as presently disclosed. The resulting semiconductor device 1300 is produced by using a planarization process to remove the high permittivity insulating material 1210 except for the section of high permittivity insulating material 1220 that filled the channel 1110. The insertion of the section of high permittivity insulating material 1220 increases the capacitance and, thus, the retention time of the capacitor formed between the metal contact elements 116 and 118.

FIG. 12C is a top view that shows the resulting semiconductor device 1300, wherein the side cross-sectional view of FIG. 12B is a view along a section 1350. As shown in FIG. 12C, the previously-formed channel 1110 of FIG. 11 is now filled with the section of high permittivity insulating material 1220 between metal contact elements 116 and 118. Using the same process, multiple similar constructions may result, such as the section of high permittivity insulating material 1222 between metal contact elements 112 and 114.

FIGS. 13A-13D illustrate a method having initial steps as in FIGS. 1-6 with performance of the method as in FIG. 4 leaving a first layer of low permittivity insulating material 1116 on a first surface of a first metal contact element 116 and a second layer of a low permittivity insulating material 1118 on a second surface of a second metal contact element 118.

FIG. 13A is a side cross-sectional view that shows the semiconductor device 110 after deposition of a high permittivity insulating material 710 upon the semiconductor device 110. In contrast to the deposition of the high permittivity insulating material 510 of FIG. 5, a thickness 730 of the resulting layer of high permittivity material 720 deposited within the channel 310 is less than a layer thickness 740 of the second layer currently being configured.

FIG. 13B is a side cross-sectional view that shows the semiconductor device 110 after the deposition of a metal material 810 over the layer of high permittivity material 710. The deposition of the metal material 810 is configured to deposit a section of metal 820 to fill the remainder of the channel 310.

Figure 13C:
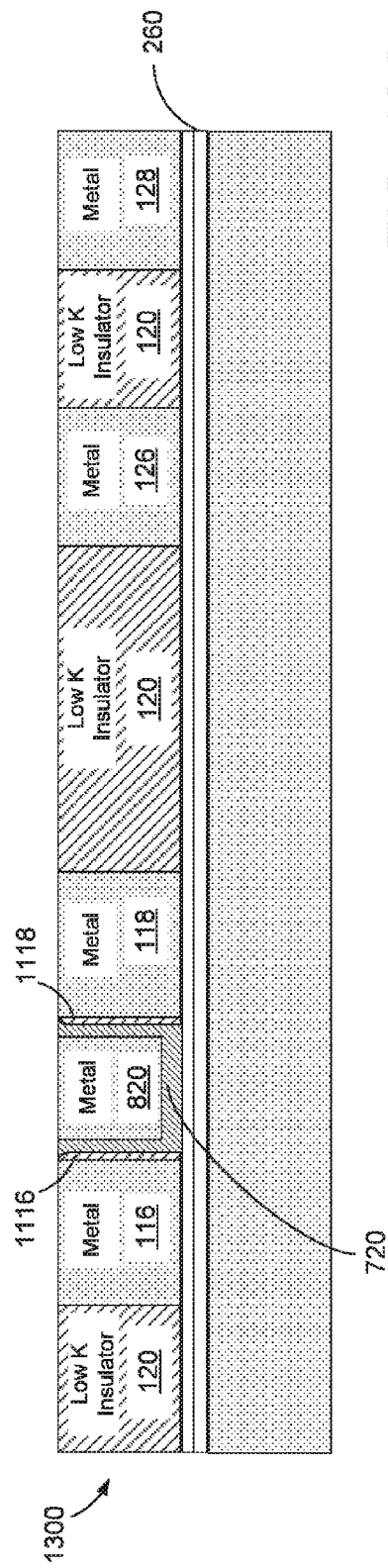
FIGS. 13C and 13D are a side cross-sectional view and a top view, respectively, of the semiconductor device of FIG. 13B from which unused portions of the layer of high permittivity material and the layer of metal have been removed.

FIG. 13C is a side cross-sectional view that shows a resulting semiconductor device 1300 formed according to a particular illustrative embodiment of a method as presently disclosed. The resulting semiconductor device 1300 is produced by using a planarization process to remove the high permittivity insulating material 710 and the metal 810 deposited on the semiconductor device 110 except for the layer of high permittivity insulating material 720 and the section of metal 820 that fill the channel 310. The introduction of the metal 820 in the layer of high permittivity insulating material 720 provides a pair of capacitors that can be coupled in parallel to create a capacitor having a high capacitance.

Figure 13D:
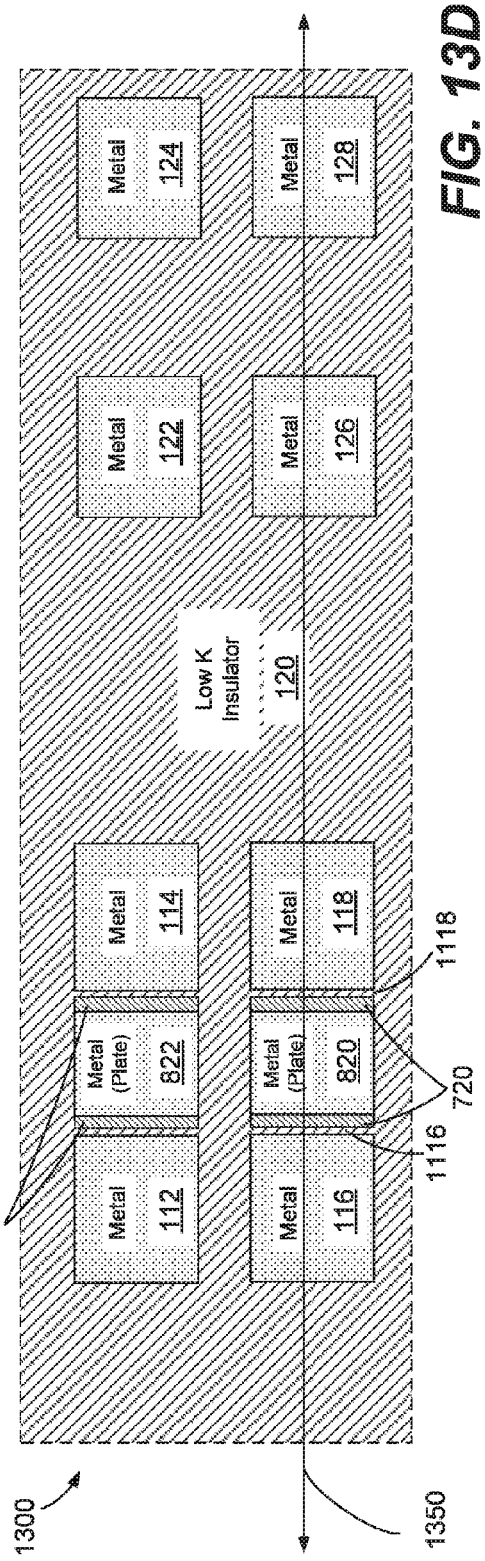

FIG. 13D is a top view that shows the resulting semiconductor device 1300, wherein the side cross-sectional view of FIG. 13C is a view along a section 1350. As shown in FIG. 13D, the previously-formed channel 310 is now filled with metal, so as to create a metal plate 820, encapsulated in a layer of high permittivity insulating material 720 between first and second layers of a low permittivity insulating material 1116 and 1118 and between metal contact elements 116 and 118. Using the same process, multiple similar constructions may result, such as the metal plate 822 encapsulated in a layer of high permittivity insulating material 722.

Figure 14:
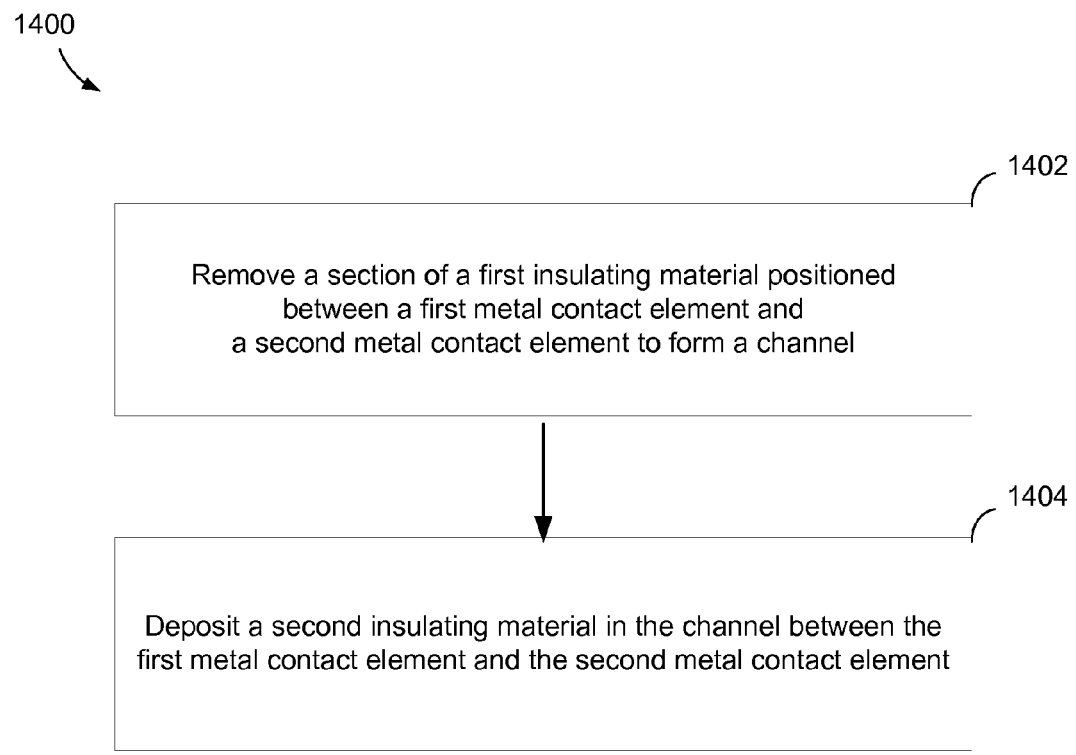
FIG. 14 is a flow chart of a particular illustrative embodiment of a method of forming a capacitor having increased capacitance in a semiconductor device.

FIG. 14 is a flow chart 1400 of a particular illustrative embodiment of a method of forming a capacitor having increased capacitance in a semiconductor device. A section of a first insulating material positioned between a first metal contact element and a second metal contact element is removed to form a channel, at 1402. A second insulating material is deposited in the channel between the first metal contact element and the second metal contact element, at 1404.

The high permittivity insulating material in the channel between the first metal contact element 116 and the second metal contact element 118 forms a layer 520, 720, and 1120 in channels 310 and 1110, respectively, as described with reference to FIGS. 5, 7, and 12A. As previously described, the high permittivity insulating material has a higher permittivity than the low permittivity insulating material 120. The low permittivity insulating material is removed by etching a section of the low permittivity insulating material 222 as described with reference to FIGS. 2A-2B, 3, and 11. The first metal contact element 116 and the second metal contact element 118 may be regarded as formed in a second layer of the semiconductor device between a first layer 290 with respect to a surface of a substrate and a photoresist layer 210 as described with reference to FIGS. 2B, 3 and 4. The first layer 290 may include an etch-stop layer as described with reference to FIG. 3.

A section of the low permittivity insulating material 222 is exposed between the first metal contact element 116 and the second metal contact element 118 as described with reference to FIGS. 1-3. Exposing the portion of the low permittivity insulating material between the first metal contact element 116 and the second metal contact element 118 comprises opening a portion of the photoresist layer 210 extending over the section of the low permittivity insulating material 222 between the first metal contact element 116 and the second metal contact element 118 as described with reference to FIGS. 2A-2B. As also previously described with reference to FIGS. 2A-2B, additional portions of the photoresist layer 210 may be opened over a section of at least one of the first metal contact element 116 and the second metal contact element 118.

Exposing the portion of the low permittivity insulating material 222 includes applying a mask 100 to define the portion of the photoresist layer 210 to be removed during a lithography process as described with reference to FIGS. 1-3. The section of the low permittivity insulating material 222 to be removed may include substantially all of the low permittivity insulating material 222 between the first metal contact element 116 and the second metal contact element 118, as described with reference to FIG. 3. The high permittivity insulating material may cover the first layer between the first metal contact element 116 and the second metal contact element 118, as described with reference to FIG. 5. The high permittivity insulating material 520 may have a thickness 530 that is at least equal to a layer thickness 540 of the second layer 292 as described with reference to FIGS. 2 and 5. Alternatively, the high permittivity insulating material 520 may have a thickness 730 that is less than a layer thickness 740 of the second layer 292 as described with reference to FIGS. 2 and 7. A metal 810 may be deposited to form a metal layer 820 over the layer of high permittivity insulating material 710 as described with reference to FIG. 7.

Removing the low permittivity insulating material 222 may leave a layer of the first insulating material 1116 and 1118 covering the first metal contact element 116 and the second metal contact element 118, respectively, as described with reference to FIG. 11. As previously described with reference to FIG. 1, the first metal contact element 116 may be regarded as comprising a first metal storage node and the second metal contact element 118 may be regarded as comprising a second metal storage node.

Figure 15:
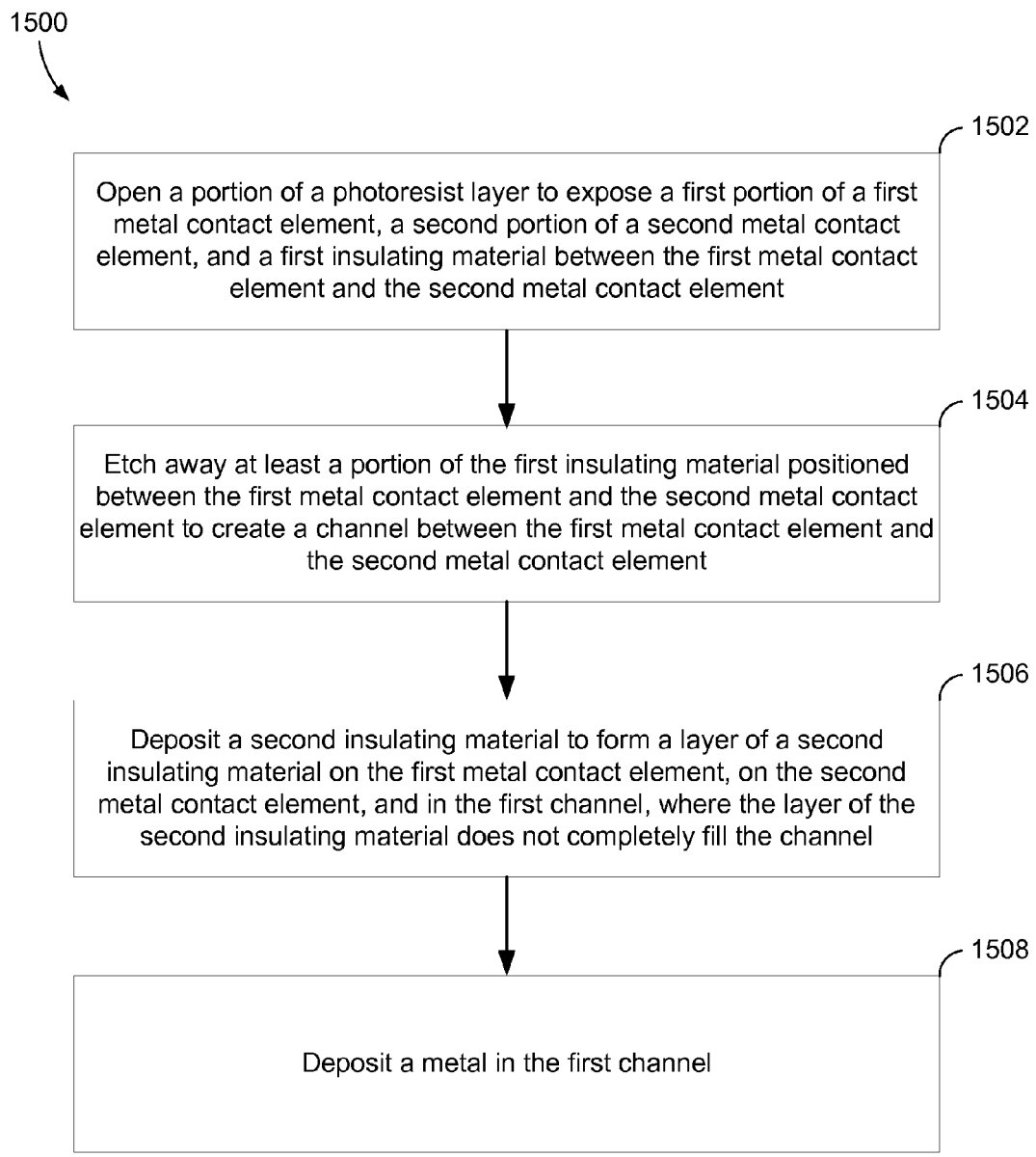
FIG. 15 is a flow chart of another particular illustrative embodiment of a method of forming a capacitor having increased capacitance in a semiconductor device.

FIG. 15 is a flow chart of another particular illustrative embodiment of a method of forming a capacitor having increased capacitance in a semiconductor device. A portion of a photoresist layer is opened to expose a first portion of a first metal contact element, a second portion of a second metal contact element, and a first insulating material between the first metal contact element and the second metal contact element, at 1502. At least a portion of the first insulating material positioned between the first metal contact element and the second metal contact element is etched away to create a channel between the first metal contact element and the second metal contact element, at 1504. A second insulating material is deposited to form a layer of a second insulating material on the first metal contact element, on the second metal contact element, and in the first channel, where the layer of the second insulating material does not completely fill the channel, at 1506. A metal is deposited in the first channel to form a metal plate, at 1508.

A planarization process may be performed to remove excess material, including excess portions of the high permittivity insulating material 710 and of the metal 810, as described with reference to FIGS. 7, 8 and 9A. The metal 820 deposited in the first channel forms a metal plate, where the first metal contact element 116 is separated from the metal plate 820 by the layer of high permittivity insulating material 720 comprises a first capacitor 1030, and the second metal contact element 118 separated from the metal plate 820 by the layer of the high permittivity insulating material 720 comprises a second capacitor 1040, as described with reference to FIGS. 9 and 10A. Electrically coupling the first capacitor 1030 in parallel with the second capacitor 1040 forms an enhanced capacitor 1050, as described with reference to FIGS. 10A-10B. Specifically, electrically coupling the first capacitor 1030 in parallel with the second capacitor 1040 comprises electrically coupling the first metal contact element 116 to the second metal contact element 118 to form a first contact 1020 of the enhanced capacitor 1050, and the metal plate 820 comprises a second contact 1010 of the enhanced capacitor 1050, as described with reference to FIG. 10A.

Figure 16:
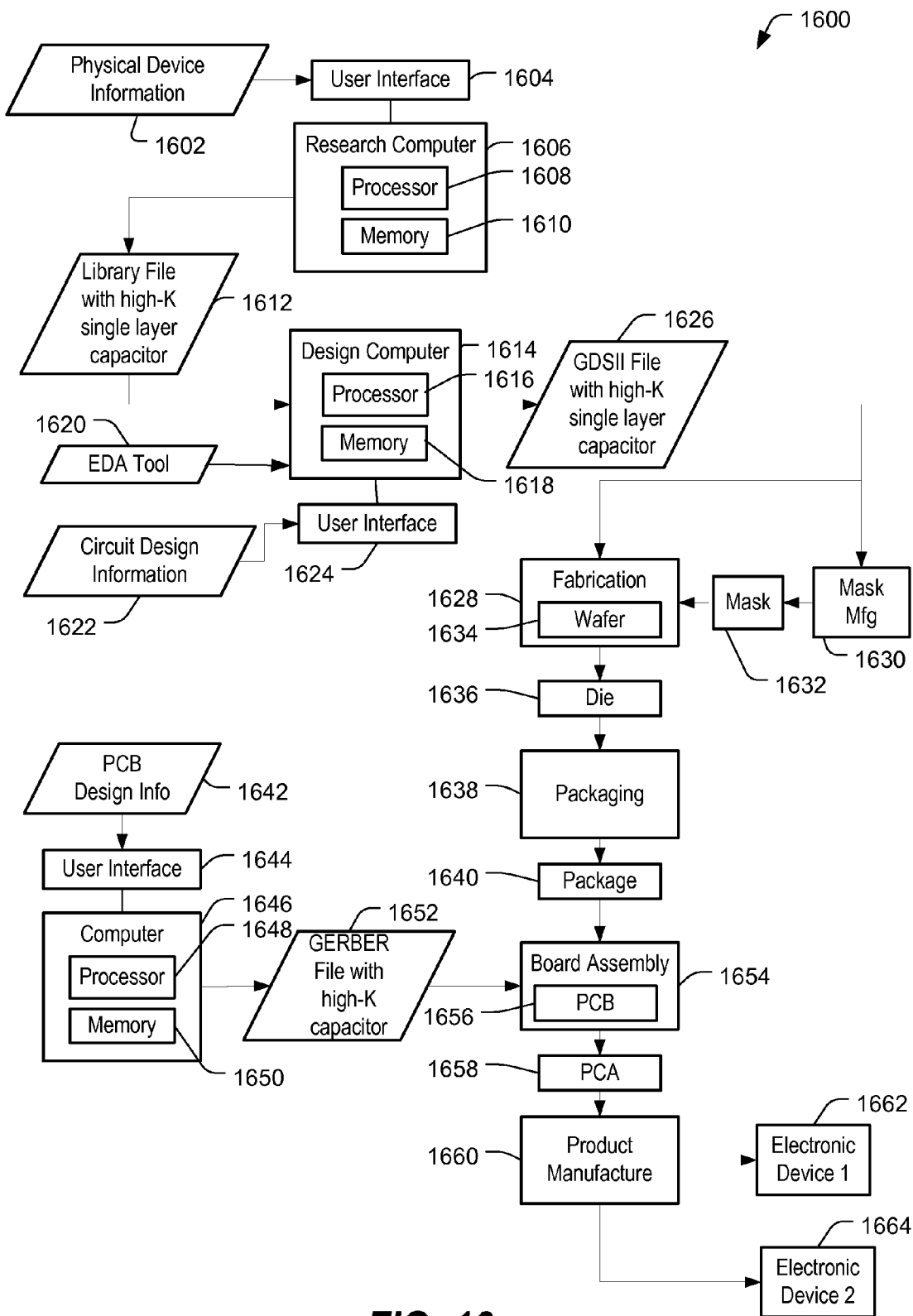
FIG. 16 is a data flow diagram of a particular illustrative embodiment of a manufacturing process to manufacture electronic devices that include a high-permittivity single-layer semiconductor capacitor devices.

The foregoing disclosed devices and functionality may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 16 depicts a particular illustrative embodiment of an electronic device manufacturing process 1600.

Physical device information 1602 is received in the manufacturing process 1600, such as at a research computer 1606. The physical device information 1602 may include design information representing at least one physical property of a semiconductor device, such as the higher capacitance device formed in accordance with FIGS. 1-6, the capacitor having a higher capacitance formed in accordance with FIGS. 7-9B, the capacitor structure depicted in FIGS. 10A-B, the capacitors having a higher capacitance formed in accordance with FIGS. 11-13D, a capacitor formed according to the method of FIG. 14 or the method of FIG. 15, or any combination thereof. For example, the physical device information 1602 may include physical parameters, material characteristics, and structure information that is entered via a user interface 1604 coupled to the research computer 1606. The research computer 1606 includes a processor 1608, such as one or more processing cores, coupled to a computer readable medium such as a memory 1610. The memory 1610 may store computer readable instructions that are executable to cause the processor 1608 to transform the physical device information 1602 to comply with a file format and to generate a library file 1612.

In a particular embodiment, the library file 1612 includes at least one data file including the transformed design information. For example, the library file 1612 may include a library of semiconductor devices including a high-permittivity single-layer semiconductor capacitor device, such as a device formed in accordance with FIGS. 1-6, FIGS. 7-9B, FIGS. 10A-B, FIGS. 11-13D, the method of FIG. 14, the method of FIG. 15, or any combination thereof, that is provided for use with an electronic design automation (EDA) tool 1620.

The library file 1612 may be used in conjunction with the EDA tool 1620 at a design computer 1614 including a processor 1616, such as one or more processing cores, coupled to a memory 1618. The EDA tool 1620 may be stored as processor executable instructions at the memory 1618 to enable a user of the design computer 1614 to design a circuit including a high-permittivity single-layer semiconductor capacitor device, such as a device formed in accordance with FIGS. 1-6, FIGS. 7-9B, FIGS. 10A-B, FIGS. 11-13D, the method of FIG. 14, the method of FIG. 15, or any combination thereof, of the library file 1612. For example, a user of the design computer 1614 may enter circuit design information 1622 via a user interface 1624 coupled to the design computer 1614. The circuit design information 1622 may include design information representing at least one physical property of a semiconductor device, such as a device formed in accordance with FIGS. 1-6, FIGS. 7-9B, FIGS. 10A-B, FIGS. 11-13D, the method of FIG. 14, the method of FIG. 15, or any combination thereof. To illustrate, the circuit design property may include identification of particular circuits and relationships to other elements in a circuit design, positioning information, feature size information, interconnection information, or other information representing a physical property of a semiconductor device.

The design computer 1614 may be configured to transform the design information, including the circuit design information 1622 to comply with a file format. To illustrate, the file formation may include a database binary file format representing planar geometric shapes, text labels, and other information about a circuit layout in a hierarchical format, such as a Graphic Data System (GDSII) file format. The design computer 1614 may be configured to generate a data file including the transformed design information, such as a GDSII file 1626 that includes information describing a high-permittivity single-layer semiconductor capacitor device, such as a device formed in accordance with FIGS. 1-6, FIGS. 7-9B, FIGS. 10A-B, FIGS. 11-13D, the method of FIG. 14, the method of FIG. 15, or any combination thereof, in addition to other circuits or information. To illustrate, the data file may include information corresponding to a system-on-chip (SOC) that includes the capacitor depicted in FIG. 6 and that also includes additional electronic circuits and components within the SOC.

The GDSII file 1626 may be received at a fabrication process 1628 to manufacture the capacitor device depicted in FIGS. 1-6, FIGS. 7-9B, FIGS. 10A-B, FIGS. 11-13D, such as by incorporating the method of FIG. 14, the method of FIG. 15, or any combination thereof, according to transformed information in the GDSII file 1626. For example, a device manufacture process may include providing the GDSII file 1626 to a mask manufacturer 1630 to create one or more masks, such as masks to be used for photolithography processing, illustrated as a representative mask 1632. The mask 1632 may be used during the fabrication process to generate one or more wafers 1634, which may be tested and separated into dies, such as a representative die 1636. The die 1636 includes a circuit including the capacitor device depicted in FIGS. 1-6, FIGS. 7-9B, FIGS. 10A-B, FIGS. 11-13D, such as incorporating the method of FIG. 14, the method of FIG. 15, or any combination thereof.

The die 1636 may be provided to a packaging process 1638 where the die 1636 is incorporated into a representative package 1640. For example, the package 1640 may include the single die 1636 or multiple dies, such as a system-in-package (SiP) arrangement. The package 1640 may be configured to conform to one or more standards or specifications, such as Joint Electron Device Engineering Council (JEDEC) standards.

Information regarding the package 1640 may be distributed to various product designers, such as via a component library stored at a computer 1646. The computer 1646 may include a processor 1648, such as one or more processing cores, coupled to a memory 1650. A printed circuit board (PCB) tool may be stored as processor executable instructions at the memory 1650 to process PCB design information 1642 received from a user of the computer 1646 via a user interface 1644. The PCB design information 1642 may include physical positioning information of a packaged semiconductor device on a circuit board, the packaged semiconductor device corresponding to the package 1640 including the capacitor device depicted in FIGS. 1-6, FIGS. 7-9B, FIGS. 10A-B, FIGS. 11-13D, or formed in accordance with the method of FIG. 14, the method of FIG. 15, or any combination thereof.

The computer 1646 may be configured to transform the PCB design information 1642 to generate a data file, such as a GERBER file 1652 with data that includes physical positioning information of a packaged semiconductor device on a circuit board, as well as layout of electrical connections such as traces and vias, where the packaged semiconductor device corresponds to the package 1640 including the capacitor device depicted in FIGS. 1-6, FIGS. 7-9B, FIGS. 10A-B, FIGS. 11-13D, or formed in accordance with the method of FIG. 14, the method of FIG. 15, or any combination thereof. In other embodiments, the data file generated by the transformed PCB design information may have a format other than a GERBER format.

The GERBER file 1652 may be received at a board assembly process 1654 and used to create PCBs, such as a representative PCB 1656, manufactured in accordance with the design information stored within the GERBER file 1652. For example, the GERBER file 1652 may be uploaded to one or more machines for performing various steps of a PCB production process. The PCB 1656 may be populated with electronic components including the package 1640 to form a represented printed circuit assembly (PCA) 1658.

The PCA 1658 may be received at a product manufacture process 1660 and integrated into one or more electronic devices, such as a first representative electronic device 1662 and a second representative electronic device 1664. As an illustrative, non-limiting example, the first representative electronic device 1662, the second representative electronic device 1664, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1662 and 1664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 16 may illustrate remote units according to the teachings of the disclosure, the disclosure is not limited to these exemplary illustrated units. Embodiments of the disclosure may be suitably employed in any device which includes active integrated circuitry including memory and on-chip circuitry for test and characterization.

Thus, the capacitor device depicted in FIGS. 1-6, FIGS. 7-9B, FIGS. 10A-B, FIGS. 11-13D, such as incorporating the method of FIG. 14, the method of FIG. 15, or any combination thereof, may be fabricated, processed, and incorporated into an electronic device, as described in the illustrative process 1600. One or more aspects of the embodiments disclosed with respect to FIGS. 1-15 may be included at various processing stages, such as within the library file 1612, the GDSII file 1626, and the GERBER file 1652, as well as stored at the memory 1610 of the research computer 1606, the memory 1618 of the design computer 1614, the memory 1650 of the computer 1646, the memory of one or more other computers or processors (not shown) used at the various stages, such as at the board assembly process 1654, incorporated into one or more other physical embodiments such as the mask 1632, the die 1636, the package 1640, the PCA 1658, other products such as prototype circuits or devices (not shown), or any combination thereof. Although various representative stages of production from a physical device design to a final product are depicted, in other embodiments fewer stages may be used or additional stages may be included. Similarly, the process 1600 may be performed by a single entity, or by one or more entities performing various stages of the process 1600.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method of forming a capacitor, the method comprising:
    removing a section of a first insulating material positioned between a first metal contact element and a second metal contact element to form a channel, wherein removing the section of the first insulating material leaves a layer of the first insulating material in the channel covering the first metal contact element and the second metal contact element; and
    depositing a second insulating material to form a layer of the second insulating material in the channel,
    wherein the first metal contact element and the second insulating material are separated by the layer of the first insulating material, wherein the second metal contact element and the second insulating material are separated by the layer of the first insulating material, and wherein the second insulating material has a second permittivity value that is different than a first permittivity value of the first insulating material.

2. The method of claim 1, wherein removing the section of the first insulating material comprises etching the first insulating material.

3. The method of claim 1, wherein the first metal contact element and the second metal contact element are formed in a second layer of a semiconductor device between a first layer with respect to a surface of a substrate and a photoresist layer.

4. The method of claim 3, further comprising exposing an area of the first insulating material between the first metal contact element and the second metal contact element.

5. The method of claim 4, wherein exposing the area between the first metal contact element and the second metal contact element comprises opening a portion of the photoresist layer extending over the section of the first insulating material between the first metal contact element and the second metal contact element.

6. The method of claim 4, wherein exposing the area of the first insulating material includes applying a mask to define a portion of the photoresist layer to be removed during a lithography process.

7. The method of claim 5, further comprising opening an additional portion of the photoresist layer over a portion of at least one of the first metal contact element and the second metal contact element.

8. The method of claim 1, wherein the first metal contact element comprises a first metal storage node and the second metal contact element comprises a second metal storage node.

9. The method of claim 1, further comprising performing a planarization process to remove excess material extending outside the channel.

10. The method of claim 1, wherein the second permittivity value of the second insulating material is greater than the first permittivity value of the first insulating material.

11. A method of forming a capacitor, the method comprising:
    etching away a portion of a first insulating material positioned between a first metal contact element and a second metal contact element to create a channel in the first insulating material, wherein, after the portion of the first insulating material is etched away, a first portion of the first insulating material remains in the channel on a first surface of the first metal contact element and a second portion of the first insulating material remains in the channel on a second surface of the second metal contact element; and
    depositing a second insulating material in the channel between the first portion of the first insulating material and the second portion of the first insulating material to form a layer of the second insulating material in the channel,
    wherein the first metal contact element and the second insulating material are separated by the layer of the first insulating material, wherein the second metal contact element and the second insulating material are separated by the layer of the first insulating material, and wherein the second insulating material has a second permittivity value that is different than a first permittivity value of the first insulating material.

12. The method of claim 11, further comprising performing a planarization process to remove excess material extending outside the channel, wherein the excess material comprises at least the second insulating material.

13. The method of claim 11, wherein the second permittivity value of the second insulating material is greater than the first permittivity value of the first insulating material.

14. The method of claim 11, wherein the second insulating material has a thickness that is at least equal to a thickness of a second layer.

15. A method of forming a capacitor, the method comprising:
a removing step for removing a section of a first insulating material positioned between a first metal contact element and a second metal contact element to form a channel, wherein removing the section of the first insulating material leaves a layer of the first insulating material in the channel covering the first metal contact element and the second metal contact element; and
a depositing step for depositing a second insulating material in the channel to form a layer of the second insulating material in the channel,
wherein the first metal contact element and the second insulating material are separated by the layer of the first insulating material, wherein the second metal contact element and the second insulating material are separated by the layer of the first insulating material, and wherein the second insulating material has a second permittivity value that is different than a first permittivity value of the first insulating material.

16. The method of claim 15, further comprising performing a planarization process to remove excess material extending outside the channel.

17. A method of manufacturing a semiconductor device, the method comprising:
receiving, at one or more processors, design information representing at least one physical property of the semiconductor device, the semiconductor device prepared by a process comprising:
removing a section of a first insulating material positioned between a first metal contact element and a second metal contact element to form a channel, wherein removing the section of the first insulating material leaves a layer of the first insulating material in the channel covering the first metal contact element and the second metal contact element; and
depositing a second insulating material in the channel to form a layer of the second insulating material in the channel,
wherein the first metal contact element and the second insulating material are separated by the layer of the first insulating material, wherein the second metal contact element and the second insulating material are separated by the layer of the first insulating material, and wherein the second insulating material has a second permittivity value that is different than a first permittivity value of the first insulating material;
transforming, at the one or more processors, the design information to comply with a file format;
generating, at the one or more processors, a data file including the transformed design information; and
manufacturing the semiconductor device according to the transformed design information from the data file.

18. The method of claim 17, wherein the data file is included in a library of semiconductor devices.

19. The method of claim 18, further comprising providing the library of semiconductor devices for use with an electronic design automation tool.

20. The method of claim 17, wherein the file format includes a GDSII format.

21. A method comprising:
receiving a data file including design information corresponding to a semiconductor device; and
fabricating the semiconductor device according to the design information, wherein the semiconductor device is prepared by a process comprising:
removing a section of a first insulating material positioned between a first metal contact element and a second metal contact element to form a channel, wherein removing the section of the first insulating material leaves a layer of the first insulating material in the channel covering the first metal contact element and the second metal contact element; and
depositing a second insulating material in the channel to form a layer of the second insulating material in the channel,
wherein the first metal contact element and the second insulating material are separated by the layer of the first insulating material, wherein the second metal contact element and the second insulating material are separated by the layer of the first insulating material, and wherein the second insulating material has a second permittivity value that is different than a first permittivity value of the first insulating material.

22. The method of claim 21, wherein the data file includes a GPSII format.

23. A method of manufacturing a packaged semiconductor device, the method comprising:
receiving, at one or more processors, design information including physical positioning information of the packaged semiconductor device on a circuit board, the packaged semiconductor device including a semiconductor structure prepared by a process comprising:
removing a section of a first insulating material positioned between a first metal contact element and a second metal contact element to form a channel, wherein removing the section of the first insulating material leaves a layer of the first insulating material in the channel covering the first metal contact element and the second metal contact element; and
depositing a second insulating material in the channel to form a layer of the second insulating material in the channel,
wherein the first metal contact element and the second insulating material are separated by the layer of the first insulating material, wherein the second metal contact element and the second insulating material are separated by the layer of the first insulating material, and wherein the second insulating material has a second permittivity value that is different than a first permittivity value of the first insulating material;
transforming, at the one or more processors, the design information to generate a data file; and
manufacturing the packaged semiconductor device according to the transformed design information from the data file.

24. The method of claim 23, wherein the data file has a GERBER format.

25. A method comprising:
receiving a data file including design information including physical positioning information of a packaged semiconductor device on a circuit board; and
manufacturing the circuit board according to the design information, wherein the packaged semiconductor device includes a semiconductor capacitor structure prepared by a process comprising:

removing a section of a first insulating material positioned between a first metal contact element and a second metal contact element to form a channel, wherein removing the section of the first insulating material leaves a layer of the first insulating material in the channel covering the first metal contact element and the second metal contact element; and depositing a second insulating material in the channel to form a layer of the second insulating material in the channel, wherein the first metal contact element and the second insulating material are separated by the layer of the first insulating material, wherein the second metal contact element and the second insulating material are separated by the layer of the first insulating material, and wherein the second insulating material has a second permittivity value that is different than a first permittivity value of the first insulating material.

26. The method of claim 25, wherein the data file has a GERBER format.

27. The method of claim 25, further comprising integrating the circuit board into a device selected from a set top box, a music player, a video player, an entertainment unit, a navigation device, a communications device, a personal digital assistant (PDA), a fixed location data unit, and a computer.

28. A method of forming a capacitor, the method comprising:

removing a section of a first insulating material positioned between a first metal contact element and a second metal contact element to form a channel, wherein removing the section of the first insulating material leaves a layer of the first insulating material in the channel covering the first metal contact element and the second metal contact element; and depositing a second insulating material to form a layer of the second insulating material in the channel, wherein the second insulating material has a second permittivity value that is different than a first permittivity value of the first insulating material.

29. The method of claim 28, further comprising depositing a metal over the layer of the second insulating material to form a metal plate, wherein the first metal contact element and the metal plate are separated by the layer of the second insulating material to form a first capacitor, and wherein the second metal contact element and the metal plate are separated by the layer of the second insulating material to form a second capacitor.

30. The method of claim 29, further comprising electrically coupling a third metal contact element to the first metal contact element and to the second metal contact element, and electrically coupling a fourth metal contact element to the metal plate.

31. The method of claim 28, wherein removing the section of the first insulating material comprises etching the first insulating material.

32. The method of claim 28, further comprising exposing an area of the first insulating material between the first metal contact element and the second metal contact element.

33. The method of claim 32, wherein exposing the area between the first metal contact element and the second metal contact element comprises removing a first portion of a photoresist layer extending over the section of the first insulating material between the first metal contact element and the second metal contact element.

34. The method of claim 32, further comprising applying a mask over a photoresist layer before exposing the area of the first insulating material, the mask defining a portion of the photoresist layer to be removed during a lithography process.

35. The method of claim 33, further comprising removing, with the first portion, an additional portion of the photoresist layer, the additional portion located over a portion of at least one of the first metal contact element and the second metal contact element.

36. The method of claim 28, wherein the second insulating material covers the layer of the first insulating material in the channel between the first metal contact element and the second metal contact element.

37. The method of claim 28, further comprising:
forming a first layer on a substrate of a semiconductor device; and
forming the first metal contact element and the second metal contact element,
wherein the first metal contact element and the second metal contact element are in a second layer of the semiconductor device between the first layer and a photoresist layer.

38. The method of claim 37, wherein the second insulating material has a thickness that is equal to or greater than a thickness of the second layer.

39. A method of forming a capacitor, the method comprising:

etching away a portion of a first insulating material positioned between a first metal contact element and a second metal contact element to create a channel in the first insulating material, wherein, after the portion of the first insulating material is etched away, a first portion of the first insulating material remains in the channel on a first surface of the first metal contact element and a second portion of the first insulating material remains in the channel on a second surface of the second metal contact element; and depositing a second insulating material in the channel between the first portion of the first insulating material and the second portion of the first insulating material to form a layer of the second insulating material in the channel, wherein the second insulating material has a second permittivity value that is different than a first permittivity value of the first insulating material.

40. The method of claim 39, further comprising performing a planarization process to remove excess material extending outside the channel.

41. The method of claim 39, wherein the second insulating material covers the layer between the first metal contact element and the second metal contact element.

42. The method of claim 39, further comprising depositing a metal over the layer of the second insulating material to form a metal plate, wherein the first metal contact element and the metal plate are separated by the layer of the second insulating material to form a first capacitor, and wherein the second metal contact element and the metal plate are separated by the layer of the second insulating material to form a second capacitor.

43. The method of claim 42, further comprising electrically connecting a third metal contact element to the first metal contact element and to the second metal contact element, and electrically connecting a fourth metal contact element to the metal plate.

44. The method of claim 39, further comprising integrating the first metal contact element and the second metal contact element into a storage device.

45. The method of claim 39, further comprising exposing an area of the first insulating material between the first metal contact element and the second metal contact element.

\* \* \* \* \*